(12) United States Patent
Kavcic et al.

(10) Patent No.: US 6,201,839 B1
(45) Date of Patent: Mar. 13, 2001

(54) METHOD AND APPARATUS FOR CORRELATION-SENSITIVE ADAPTIVE SEQUENCE DETECTION

(75) Inventors: Aleksandar Kavcic; Jose M. F. Moura, both of Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 09/055,003

(22) Filed: Apr. 3, 1998

Related U.S. Application Data
(60) Provisional application No. 60/046,006, filed on May 9, 1997.

(51) Int. Cl.$^7$ ............................................ H03D 1/00
(52) U.S. Cl. ................................. 375/341; 714/796
(58) Field of Search ................................ 375/262, 265, 375/285, 340, 341, 343, 348; 714/791, 792, 793, 794, 795, 796, 719, 716, 722

(56) References Cited

U.S. PATENT DOCUMENTS

| | | | |
|---|---|---|---|
| 5,689,532 | * 11/1997 | Fitzpatrick | 375/341 |
| 5,737,342 | *  4/1998 | Ziperovich | 714/736 |
| 5,781,590 | *  7/1998 | Shiokawa et al. | 375/341 |
| 5,784,415 | *  7/1998 | Chevillat et al. | 375/341 |
| 5,844,946 | * 12/1998 | Nagayasu | 375/341 |
| 5,856,983 | *  1/1999 | Okazaki | 371/21.4 |
| 5,862,192 | *  1/1999 | Huszar et al. | 375/347 |
| 5,914,988 | *  6/1999 | Hu et al. | 375/341 |
| 5,920,599 | *  7/1999 | Igarashi | 375/341 |
| 5,937,020 | *  8/1999 | Hase et al. | 375/376 |
| 5,970,091 | * 10/1999 | Nishida et al. | 375/231 |
| 5,978,426 | * 11/1999 | Glover et al. | 375/376 |

OTHER PUBLICATIONS

Nakagawa et al., "A Study on Detection Methods of NRZ Recording", IEEE Trans. On Magnetics, vol. MAG–16, No. 1, pp. 104–10, Jan. 1980.

Chevillat et al., "Noise–Predictive Partial–Response Equalizers and Applications," IEEE ICC '92 Conference Record, pp. 942–47, Jun. 1992.

Zeng et al., "Modified Viterbi Algorithm for Jitter–dominant 1–$D^2$ Channel," IEEE Trans. On Magnetics, vol. 28, No. 5, pp. 2895–97, Sep. 1992.

Lee et al., "Performance Analysis of the Modified Maximum Likelihood Sequence Detector in the Presence of Data–dependent Noise", Proceedings of the $26^{th}$ Asilomar Conference, pp. 961–64, Oct. 1992.

Zayad et al., "Comparison of Equalization & Detection for Very High–Density Magnetic Recording," IEEE Intermag Conference, Apr. 1997.

\* cited by examiner

*Primary Examiner*—Chi H. Pham
*Assistant Examiner*—Emmanuel Bayard
(74) *Attorney, Agent, or Firm*—Kirkpatrick & Lockhart LLP

(57) ABSTRACT

The present invention is directed to a method of determining branch metric values for branches of a trellis for a Viterbi-like detector. The method includes the step of selecting a branch metric function for each of the branches at a certain time index. The method also includes the step of applying the selected function to a plurality of time variant signal samples to determine the metric values.

28 Claims, 10 Drawing Sheets

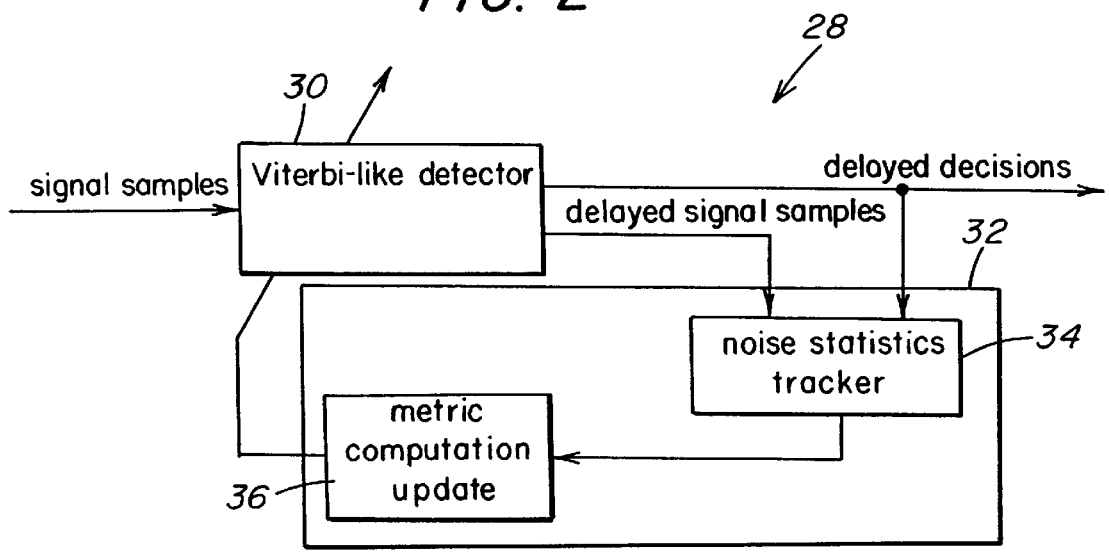
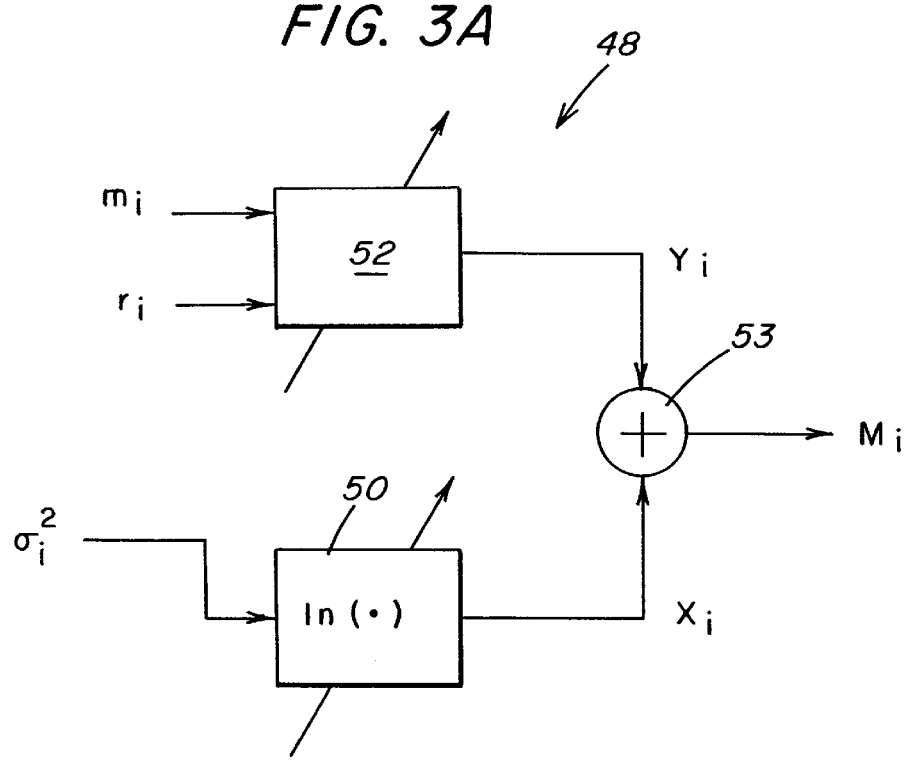

METHOD AND APPARATUS FOR CORRELATION-SENSITIVE ADAPTIVE SEQUENCE DETECTION

CROSS REFERENCE TO RELATED APPLICATIONS

This application claims priority to Provisional Serial No. 60/046,006, filed May 9, 1997, under 35 U.S.C. Section 119(e).

STATEMENT REGARDING FEDERALLY SPONSORED RESEARCH

This invention was supported in part by the National Science Foundation under Grant No. ECD-8907068. The United States Government has certain rights in this invention.

BACKGROUND OF THE INVENTION

1. Field of the Invention

The present invention is directed generally to high density magnetic recording sequence detectors, and, more particularly, to correlation-sensitive sequence detectors.

2. Description of the Background

In recent years, there has been a major shift in the design of signal detectors in magnetic recording. Traditional peak detectors (PD), such as those described in Nakagawa et al., "A Study of Detection Methods of NRZ Recording", IEEE Trans. Magn., vol. 16, pp. 1041–110, Jan. 1980, have been replaced by Viterbi-like detectors in the form of partial response maximum likelihood (PRML) schemes or hybrids between tree/trellis detectors and decision feedback equalizers (DFE), such as FDTS/DF, MDFE and RAM-RSE. These methods were derived under the assumption that additive white Gaussian noise (AWGN) is present in the system. The resulting trellis/tree branch metrics are then computed as Euclidian distances.

It has long been observed that the noise in magnetic recording systems is neither white nor stationary. The non-stationarity of the media noise results from its signal dependent nature. Combating media noise and its signal dependence has thus far been confined to modifying the Euclidian branch metric to account for these effects. Zeng, et al., "Modified Viterbi Algorithm for Jitter-Dominated 1-$D^2$ Channel," IEEE Trans. Magn., Vol. MAG-28, pp. 2895–97, Sept. 1992, and Lee et al., "Performance Analysis of the Modified maximum Likelihood Sequence Detector in the Presence of Data-Dependent Noise," Proceedings 26th Asilomar Conference, pp. 961–64, Oct. 1992 have derived a branch metric computation method for combating the signal-dependent character of media noise. These references ignore the correlation between noise samples. The effectiveness of this method has been demonstrated on real data in Zayad et al., "Comparison of Equalization and Detection for Very High-Density Magnetic Recording," IEEE INTERMAG Conference, New Orleans, April 1997.

These methods do not take into consideration the correlation between noise samples in the readback signal. These correlations arise due to noise coloring by front-end equalizers, media noise, media nonlinearities, and magnetoresistive (MR) head nonlinearities. This noise coloring causes significant performance degradation at high recording densities. Thus, there is a need for an adaptive correlation-sensitive maximum likelihood sequence detector which derives the maximum likelihood sequence detector (MLSD) without making the usual simplifying assumption that the noise samples are independent random variables.

SUMMARY OF THE INVENTION

In high density magnetic recording, noise samples corresponding to adjacent signal samples are heavily correlated as a result of front-end equalizers, media noise, and signal nonlinearities combined with nonlinear filters to cancel them. This correlation deteriorates significantly the performance of detectors at high densities.

The trellis/tree branch metric computation of the present invention is correlation-sensitive, being both signal-dependent and sensitive to correlations between noise samples. This method is termed the correlation-sensitive maximum likelihood sequence detector (CS-MLSD), or simply correlation-sensitive sequence detector (CS-SD).

Because the noise statistics are non-stationary, the noise sensitive branch metrics are adaptively computed by estimating the noise covariance matrices from the read-back data. These covariance matrices are different for each branch of the tree/trellis due to the signal dependent structure of the media noise. Because the channel characteristics in magnetic recording vary from track to track, these matrices are tracked on-the-fly, recursively using past samples and previously made detector decisions.

The present invention represents a substantial advance over prior sequence detectors. Because the present invention takes into account the correlation between noise samples in the readback signal, the detected data sequence is detected with a higher degree of accuracy. Those advantages and benefits of the present invention, and others, will become apparent from the Detailed Description of the Invention hereinbelow.

BRIEF DESCRIPTION OF THE DRAWINGS

For the present invention to be clearly understood and readily practiced, the present invention will be described in conjunction with the following figures wherein:

FIG. 2 is an illustration of a CS-MLSD detector circuit of a preferred embodiment of the present invention;

FIG. 3A is an illustration of a branch metric computation module;

DETAILED DESCRIPTION OF THE INVENTION

Figure 1:
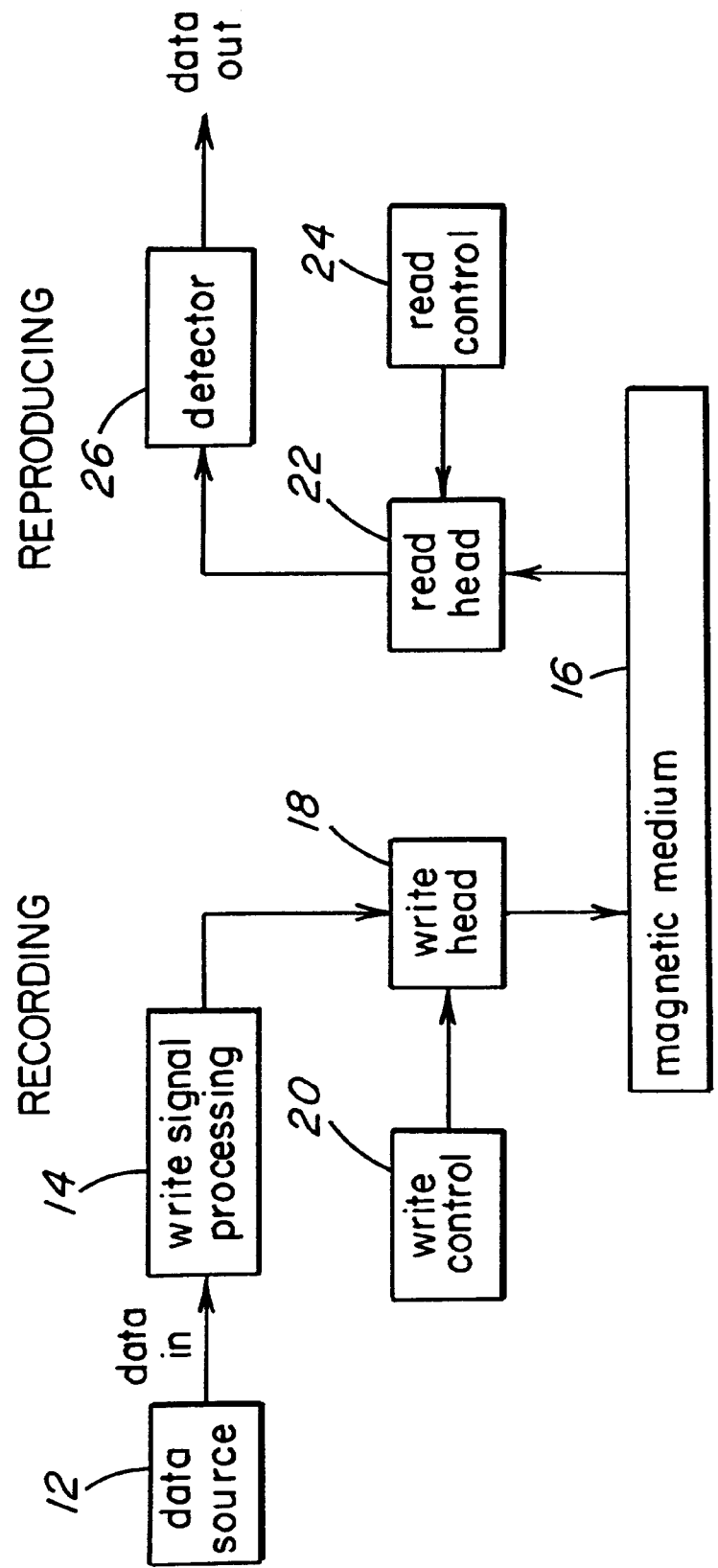
FIG. 1 is an illustration of a magnetic recording system.

FIG. 1 illustrates a magnetic recording system 10. A data source 12 supplies data to a write signal processing circuit 14. The signal processing circuit 14 converts the input data into signals with a format suitable for storage on a magnetic medium 16. The medium 16 is typically a rotating disk, a "floppy" disk, or a tape with magnetic coatings. A write head 18 stores the signals on the medium 16 as a series of variations in the magnetic flux of the medium 16. The write head 18 is controlled by a write control circuit 20, which supplies signals to the write head 18 to control its position with respect to the medium 16.

A read head 22 retrieves the variations in the magnetic flux that are stored on the medium 16. A read control circuit 24 supplies signals to the read head 22 to control its position with respect to the medium 16. The read head 22 provides a stream of data to a detector circuit 26. The detector circuit 26 detects the data from the data stream and outputs the data. The detector 26 must be able to detect the data in the presence of intersymbol interference ("ISI") noise. Prior art detector circuits have employed the maximum likelihood sequence ("MLS") estimation algorithm or peak detection techniques. The MLS algorithm analyzes a sequence of consecutive data and determines the output data based on the sequence. Peak detection techniques identify analog peaks in a sequence of data and determine the output data based on the peaks.

A block diagram of a CS-MLSD detector circuit 28 is shown in FIG. 2. The CS-MLSD detector circuit 28 is a part of the detector circuit 26 of FIG. 1. The detector circuit 28 has a feedback circuit 32 which feeds back into a Viterbi-like detector 30. The outputs of the detector 30 are decisions and delayed signal samples, which are used by the feedback circuit 32. A noise statistics tracker circuit 34 uses the delayed samples and detector decisions to update the noise statistics, i.e., to update the noise covariance matrices. A metric computation update circuit 36 uses the updated statistics to calculate the branch metrics needed in the Viterbi-like algorithm. The algorithm does not require replacing current detectors. It simply adds two new blocks in the feedback loop to adaptively estimate the branch metrics used in the Viterbi-like detector 30.

The Viterbi-like detector 30 typically has a delay associated with it. Until the detector circuit 28 is initialized, signals of known values may be input and delayed signals are not output until the detector circuit 28 is initialized. In other types of detectors, the detector may be initialized by having the necessary values set.

Figure 3:
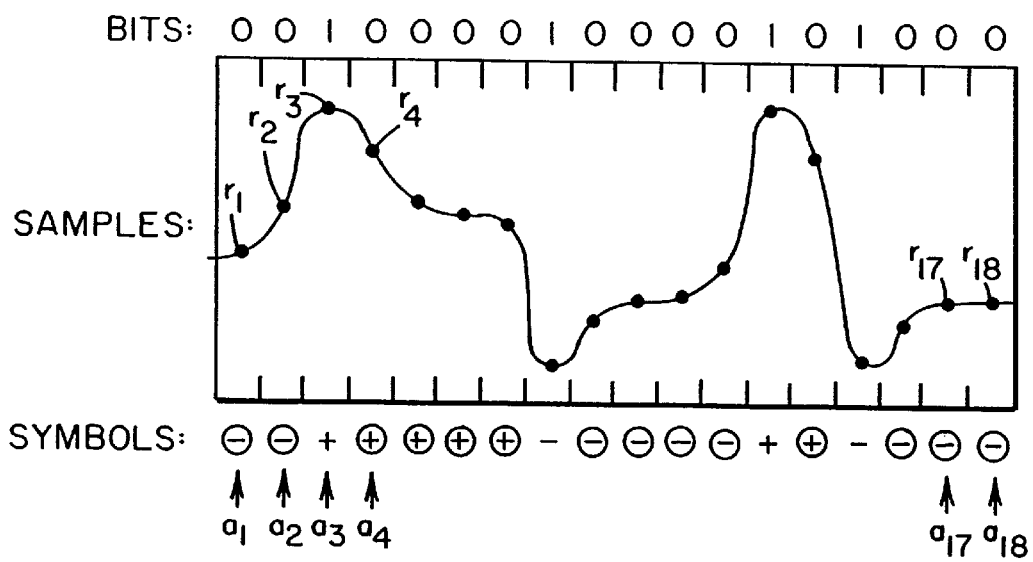
FIG. 3 is an illustration of a sample signal waveform, its samples, and written symbols.

The correlation-sensitive maximum likelihood sequence detector (CS-MLSD) 28 is described hereinbelow. Assume that N>1 channel bits (symbols), $a_1, a_2, \ldots, a_N$, are written on a magnetic medium. The symbols $a_i$, i=1, ..., N, are drawn from an alphabet of four symbols, $a_i \in \{+, \oplus, -, \ominus\}$. The symbols '+' and '−' denote a positive and a negative transition, respectively. The symbol '$\oplus$' denotes a written zero (no transition) whose nearest preceding non-zero symbol is a '+' while '$\ominus$' denotes a written zero whose nearest preceding transition is a negative one, i.e., '−'. This notation is used because a simple treatment of transitions as '1's and no transitions as '0's is blind to signal asymmetries (MR head asymmetries and base line drifts), which is inappropriate for the present problem. In FIG. 3 a sample waveform is illustrated. The signal asymmetries and base line shifts are exaggerated in FIG. 3. FIG. 3 also shows the written symbols $a_1, \ldots, a_{18}$, as well as the samples $r_1, \ldots, r_{18}$ of the read-back waveform, sampled at the rate of one sample per symbol interval.

When the written sequence of symbols $a_i$, i=1, ..., N, is read, the readback waveform is passed through a pulse-shaping equalizer and sampled one sample per symbol, resulting in the sequence of samples $r_i$, i=1, ..., N. Due to the noise in the system, the samples $r_i$ are realizations of random variables. The maximum likelihood detector determines the sequence of symbols $a_i$ that has been written, by maximizing the likelihood function, i.e.:

$$\{\hat{a}_1, \ldots, \hat{a}_N\} = \arg\left[\max_{all\ a_i} f(r_1, \ldots, r_N \mid a_1, \ldots, a_N)\right]. \quad (1)$$

In (1), the likelihood function $f(r_1, \ldots, r_N | a_1, \ldots, a_N)$ is the joint probability density function (pdf) of the signal samples $r_1, \ldots, r_N$, conditioned on the written symbols $a, \ldots, a_N$. The maximization in (1) is done over all possible combinations of symbols in the sequence $\{a_1, \ldots, a_N\}$.

Due to the signal dependent nature of media noise in magnetic recording, the functional form of joint conditional pdf $f(r_1, \ldots, r_N | a_1, \ldots, a_N)$ in (1) is different for different symbol sequences $a_1, \ldots, a_N$. Rather than making this distinction with more complex but cluttered notation, the notation is kept to a minimum by using simply the same symbol f to denote these different functions.

By Bayes rule, the joint conditional pdf (likelihood function) is factored into a product of conditional pdfs:

$$f(r_1, \ldots, r_N \mid a_i, \ldots, a_N) = \prod_{i=1}^{N} f(r_i \mid r_{i+1}, \ldots, r_N, a_1, \ldots, a_N). \quad (2)$$

To proceed and obtain more concrete results, the nature of the noise and of the intersymbol interference in magnetic recording is exploited.

Finite correlation length. The conditional pdfs in Equation (2) are assumed to be independent of future samples after some length $L \geq 0$. L is the correlation length of the noise. This independence leads to:

$$f(r_i | r_{i+1}, \ldots, r_N, a_1, \ldots, a_N) = f(r_i | r_{i+1}, \ldots, r_{i+L}, a_1, \ldots, a_N). \quad (3)$$

Finite intersymbol interference. The conditional pdf is assumed to be independent of symbols that are not in the K-neighborhood of $r_i, \ldots, r_{i+L}$. The value of $K \geq 1$ is determined by the length of the intersymbol interference (ISI). For example, for PR4, K=2, while for EPR4, K=3. $K_l \geq 0$ is defined as the length of the leading (anticausal) ISI and $K_t \geq 0$ is defined as the length of the trailing (causal) ISI, such that $K = K_l + K_t + 1$. With this notation the conditional pdf in (3) can be written as:

$$f(r_i | r_{i+1}, \ldots, r_{i+L}, a_1, \ldots, a_N) = f(r_i | r_{i+1}, \ldots r_{i+L} a_{i-K_l}). \quad (4)$$

Substituting (4) into (2) and applying Bayes rule, the factored form of the likelihood function (conditional pdf) is obtained:

$$f(r_1, \ldots, r_N | a_i, \ldots, a_N) = \prod_{i=1}^{N} f(r_i | r_{i+1}, \ldots, r_N, a_1, \ldots, a_N) \quad (5)$$

$$= \prod_{i=1}^{N} \frac{f(r_i, r_{i+1}, \ldots, r_{i+L} | a_{i-K_l}, \ldots, a_{i+L+K_t})}{f(r_{i+1}, \ldots, r_{i+L} | a_{i-K_l}, \ldots, a_{i+L+K_t})}.$$

The factored form of equation (5) is suitable for applying Viterbi-like dynamic programming detection techniques. Equation (5) assumes anticausal factorization, i.e., it is derived by taking into account the effect of the samples $r_{i+1}$, ..., $r_{i+L}$, on $r_i$. If only the causal effects are taken into account, the causal equivalent of (5) can be derived as $f(r_1, \ldots r_N | a_1, \ldots, a_N) =$ $$\prod_{i=1}^{N} \frac{f(r_i, r_{i+1}, \ldots, r_{i+L} | a_{i-K_l}, \ldots, a_{i+L+K_t})}{f(r_{i+1}, \ldots, r_{i+L-1} | a_{i-K_l}, \ldots, a_{i+L+K_t})}$$

The causal and anticausal factorization could be combined to find the geometric mean of the two to form a causal-anticausal factorization. Since this only complicates derivations and does not provide further insight, only the anticausal Equation (5) is considered.

Maximizing the likelihood function in (5) is equivalent to minimizing its negative logarithm. Thus, the maximum likelihood detector is now:

$$\{\hat{a}_1, \ldots, \hat{a}_N\} = \arg\left[\min_{\text{all } a_i} \log \prod_{i=1}^{N} \frac{f(r_{i+1}, \ldots, r_{i+L} | a_{i-K_l}, \ldots, a_{i+L+K_t})}{f(r_i, r_{i+1}, \ldots, r_{i+L} | a_{i-K_l}, \ldots, a_{i+L+K_t})}\right] \quad (6)$$

$$= \arg\left[\min_{\text{all } a_i} \sum_{i=1}^{N} \log \frac{f(r_{i+1}, \ldots, r_{i+L} | a_{i-K_l}, \ldots, a_{i+L+K_t})}{f(r_i, r_{i+1}, \ldots, r_{i+L} | a_{i-K_l}, \ldots, a_{i+L+K_t})}\right]$$

$$= \arg\left[\min_{\text{all } a_i} \sum_{i=1}^{N} M_i(r_i, r_{i+1}, \ldots, r_{i+L}, a_{i-K_l}, \ldots, a_{i+L+K_t})\right]$$

$M_i$ represents the branch metric of the trellis/tree in the Viterbi-like algorithm. The metric is a function of the observed samples $r_i, r_{i+1}, \ldots, r_{i+L}$. It is also dependent on the postulated sequence of written symbols $a_i$–$K_1$, ..., $a_i$+$L$+$K_t$, which ensures the signal-dependence of the detector. As a consequence, the branch metrics for every branch in the tree/trellis is based on its corresponding signal/noise statistics.

Specific expressions for the branch metrics that result under different assumptions on the noise statistics are next considered.

Euclidian branch metric. In the simplest case, the noise samples are realizations of independent identically distributed Gaussian random variables with zero mean and variance $\sigma^2$. This is a white Gaussian noise assumption. This implies that the correlation distance is L=0 and that the noise pdfs have the same form for all noise samples. The total ISI length is assumed to be K=$K_l$+$K_t$+1, where $K_l$ and $K_t$ are the leading and trailing ISI lengths, respectively. The conditional signal pdfs are factored as $$\frac{f(r_{i+1}, \ldots, r_{i+L} | a_{i-K_l}, \ldots, a_{i+L+K_t})}{f(r_i, r_{i+1}, \ldots, r_{i+L} | a_{i-K_l}, \ldots, a_{i+L+K_t})} = \sqrt{2\pi\sigma^2} \exp\left[\frac{(r_i - m_i)^2}{2\sigma^2}\right] \quad (7)$$

Here the mean signal $m_i$ is dependent on the written sequence of symbols. For example, for a PR4 channel, $m_i \in \{-1,0,1\}$. The branch/tree metric is then the conventional Euclidian distance metric:

$$M_i = N_i^2 = (r_i - m_i)^2 \quad (8)$$

Variance dependent branch metric. It is again assumed that the noise samples are samples of independent Gaussian variables, but that their variance depends on the written sequence of symbols. The noise correlation length is still L=0, but the variance of the noise samples is no longer constant for all samples. The variance is $\sigma_i^2$, where the index i denotes the dependence on the written symbol sequence. As for the Euclidian metric, it is assumed that the total ISI length is K=$K_l$+$K_t$+1. The conditional signal pdf is factored to give:

$$\frac{f(r_{i+1}, \ldots, r_{i+L} | a_{i-K_l}, \ldots, a_{i+L+K_t})}{f(r_i, r_{i+1}, \ldots, r_{i+L} | a_{i-K_l}, \ldots, a_{i+L+K_t})} = \sqrt{2\pi\sigma_i^2} \exp\left[\frac{(r_i - m_i)^2}{2\sigma_i^2}\right] \quad (9)$$

The corresponding branch metric is:

$$M_i = \log\sigma_i^2 + \frac{N_i^2}{\sigma_i^2} = \log\sigma_i^2 + \frac{(r_i - m_i)^2}{\sigma_i^2} \quad (10)$$

Correlation-sensitive branch metric. In the most general case, the correlation length is L>0. The leading and trailing ISI lengths are $K_l$ and $K_t$, respectively. The noise is now considered to be both correlated and signal-dependent. Joint Gaussian noise pdfs are assumed. This assumption is well justified in magnetic recording because the experimental evidence shows that the dominant media noise modes have Gaussian-like histograms. The conditional pdfs do not factor out in this general case, so the general form for the pdf is:

$$\frac{f(r_{i+1}, \ldots, r_{i+L} | a_{i-K_l}, \ldots, a_{i+L+K_t})}{f(r_i, r_{i+1}, \ldots, r_{i+L} | a_{i-K_l}, \ldots, a_{i+L+K_t})} = \quad (11)$$

$$\sqrt{\frac{(2\pi)^{L+1} \det C_i}{(2\pi)^L \det c_i}} \frac{\exp[\underline{N}_i^T C_i^{-1} \underline{N}_i]}{\exp[\underline{n}_i^T c_i^{-1} \underline{n}_i]}$$

The (L+1)×(L+1) matrix $C_i$ is the covariance matrix of the data samples $r_i, r_{i+1}, \ldots, r_{i+L}$, when a sequence of symbols $a_{i-Kl}, \ldots a_{i+L+Kt}$ is written. The matrix $c_i$ in the denominator of (11) is the L×L lower principal submatrix of $C_i$=[$c_i$]. The (L+1)-dimensional vector $\underline{N}_i$ is the vector of differences between the observed samples and their expected values when the sequence of symbols $a_{i-Kl}, \ldots, a_{i+L+Kt}$ is written, i.e.:

$$\underline{N}_i = [(r_i - m_i)(r_{i+1} - m_{i+1}) \ldots (r_{i+L} - m_{i+L})]^T \quad (12)$$

The vector $\underline{n}_i$ collects the last L elements of $\underline{N}_i$, $\underline{n}_i = [(r_{i+1} - m_{i+1}) \ldots (r_{i+L} - m_{i+L})]^T$.

With this notation, the general correlation-sensitive metric is:

$$M_i = \log \det \frac{C_i}{\det c_i} + \underline{N}_i^T C_i^{-1} \underline{N}_i - \underline{n}_i^T c_i^{-1} \underline{n}_i \qquad (13)$$

In the derivations of the branch metrics (8), (10) and (13), no assumptions were made on the exact Viterbi-type architecture, that is, the metrics can be applied to any Viterbi-type algorithm such as PRML, FDTS/DF, RAM-RSE, or, MDFE.

FIG. 3A illustrates a block diagram of a branch metric computation circuit 48 that computes the metric $M_i$ for a branch of a trellis, as in Equation (13). Each branch of the trellis requires a circuit 48 to compute the metric $M_i$.

A logarithmic circuit 50 computes the first term of the right hand side of (13)

$$\left(\text{i.e. } \log \frac{\det C_i}{\det c_i}\right)$$

and a quadratic circuit 52 computes the second terms of the right hand side of (13) (i.e. $\underline{N}_i^T C_i^{-1} \underline{N}_i - \underline{n}_i^T c_i^{-1} \underline{n}_i$). The arrows through the circuits 50 and 52 represent the adaptive nature of the Virterbi-like detector 30. A sum circuit 53 computes the sum of the outputs of the circuits 50 and 52.

As stated above, the covariance matrix is given as:

$$C_i = \begin{bmatrix} \alpha_i & \underline{c}_i \\ \underline{c}_i^T & c_i \end{bmatrix}. \qquad (14)$$

Using standard techniques of signal processing, it can be shown that:

$$\frac{\det C_i}{\det c_i} = \alpha_i - \underline{c}_i^T c_i^{-1} \underline{c}_i. \qquad (15)$$

This ratio of determinants is referred to as $\sigma_i^2$, i.e.:

$$\sigma_i^2 = \frac{\det C_i}{\det c_i} = \alpha_i - \underline{c}_i^T c_i^{-1} \underline{c}_i. \qquad (16)$$

It can be shown by using standard techniques of signal processing that the sum of the last two terms of (13), i.e. the output of the circuit 52, is:

$$Y_i = \underline{N}_i^T C_i^{-1} \underline{N}_i - \underline{n}_i^T c_i^{-1} \underline{n}_i \qquad (17)$$

$$= \frac{(\underline{w}_i^T \underline{N}_i)^2}{\sigma_i^2}, \qquad (18)$$

Where the vector $\underline{w}_i$ is (L+1)-dimensional and is given by:

$$\underline{w}_i^T = [1 \quad w_i(2) \quad w_i(3) \quad \ldots \quad (w_i(L+1))]^T \qquad (19)$$

$$= \begin{bmatrix} 1 \\ -c_i^{-1} \underline{c}_i \end{bmatrix}. \qquad (20)$$

Figure 3B:
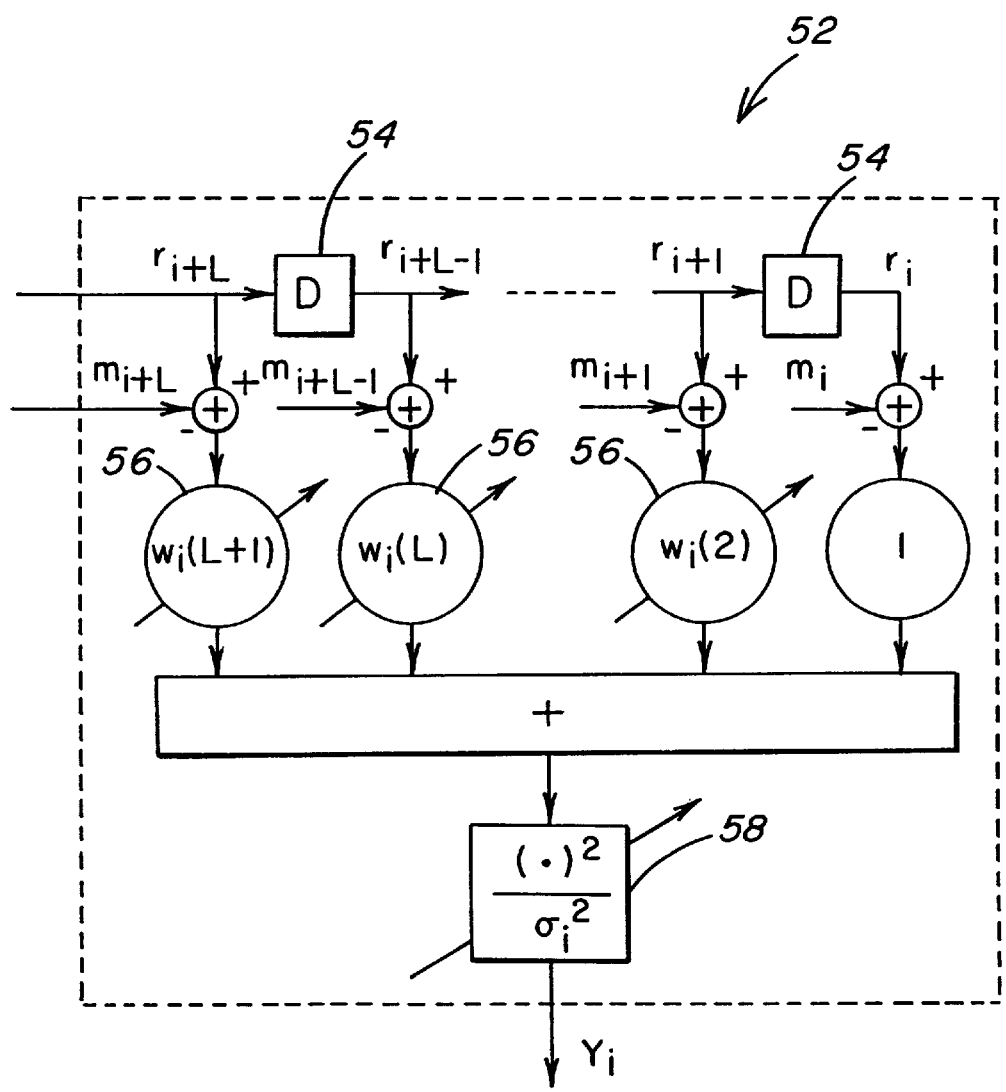
FIG. 3B is an illustration of an implementation of a portion of the branch metric computation module of FIG. 3A.

Equations (17), (18) and (16) (the circuit 52) can be implemented as a tapped-delay line as illustrated in FIG. 3B. The circuit 52 has L delay circuits 54. The tapped-delay line implementation shown in FIGS. 3A and 3B is also referred to as a moving-average, feed-forward, or finite-impulse response filter. The circuit 48 can be implemented using any type of filter as appropriate.

The adaptation of the vector of weights $\underline{w}_i$ and the quantity $\sigma_i^2$ as new decisions are made is essentially an implementation of the recursive least squares algorithm. Alternatively, the adaptation may be made using the least mean squares algorithm.

The quantities $m_i$ that are subtracted from the output of the delay circuits 54 are the target response values, or mean signal values of (12). The arrows across multipliers 56 and across square devices 58 indicate the adaptive nature, i.e., the data dependent nature, of the circuit 52. The weights $\underline{w}_i$ and the value $\sigma_i^2$ can be adapted using three methods. First, $\underline{w}_i$ and $\sigma_i^2$ can be obtained directly from Equations (20) and (16), respectively, once an estimate of the signal-dependent covariance matrix $C_i$ is available. Second, $\underline{w}_i$ and $\sigma_i^2$ can be calculated by performing a Cholesky factorization on the inverse of the covariance matrix $C_i$. For example, in the $L_i D_i^{-1} L_i^T$ Cholesky factorization, $\underline{w}_i$ is the first column of the Cholesky factor $L_i$ and $\sigma_i^2$ is the first element of the diagonal matrix $D_i$. Third, $\underline{w}_i$ and $\sigma_i^2$ can be computed directly from the data using a recursive least squares-type algorithm. In the first two methods, an estimate of the covariance matrix is obtained by a recursive least squares algorithm.

Computing the branch metrics in (10) or (13) requires knowledge of the signal statistics. These statistics are the mean signal values $m_i$ in (12) as well as the covariance matrices $C_i$ in (13). In magnetic recording systems, these statistics will generally vary from track to track. For example, the statistics that apply to a track at a certain radius will differ from those for another track at a different radius due to different linear track velocities at those radii. Also, the signal and noise statistics will be different if a head is flying slightly off-track or if it is flying directly over the track. The head skew angle is another factor that contributes to different statistics from track to track. These factors suggest that the system that implements the metric in (13) needs to be flexible to these changes. Storing the statistics for each track separately is very difficult because of the memory span required to accomplish this. A reasonable alternative is to use adaptive filtering techniques to track the needed statistics.

Tracking the mean signal values $m_i$ is generally done so that these values fall on prespecified targets. An adaptive front-end equalizer is employed to force the signal sample values to their targets. This is certainly the case with partial response targets used in algorithms like PR4, EPR4, or EEPR4 where the target is prespecified to one of the class-4 partial responses. For example, in a PR4 system, the signal samples, if there is no noise in the system, fall on one of the three target values 1, 0, or −1. Typically this is done with an LMS-class (least mean-squares) algorithm that ensures that the mean of the signal samples is close to these target values. In decision feedback equalization (DFE) based detectors or hybrids between fixed delay tree search and DFE, such as FDTS/DF or MDFE, the target response need not be prespecified. Instead, the target values are chosen on-the-fly by simultaneously updating the coefficients of the front-end and feed-back equalizers with an LMS-type algorithm.

When there are severe nonlinearities in the system (also referred to as nonlinear distortion or nonlinear ISI), a linear equalizer will generally not be able to place the signal samples right on target. Instead, the means of the signal samples will fall at a different value. For example, in a PR4 system, the response to a sequence of written symbols . . . , −,+, ⊕, . . . might result in mean sample target values . . . , 0, 1, 0.9, . . . , while a sequence of written symbols . . . , +, −, ⊖, . . . might result in a sequence of mean sample values ..., 0.95, −1.05, 0, ... Clearly, in this example, what should be a target value of 1 becomes either 1, 0.9, or 0.95 depending on the written sequence. Because mean values and not noisy samples are being considered, this deviation is due to nonlinearities in the system. There are two fixes for this problem. The first is to employ a nonlinear filter (neural network or Volterra series filter) that is capable of overcoming these nonlinear distortions. Although recently very popular, such a method introduces further correlation between noise samples due to the nonlinear character of the filter. The second fix is to track the nonlinearities in a feedback loop and use the tracked value in the metric computation. For example, let the response to a written symbol sequence ..., ⊖, +, ⊕, ... be consistently ..., 0, 1, 0.9, ... Then, rather than using the value 1 in the metric computation for the third target, this behavior can be tracked and the value $m_i = 0.9$ can be used.

In the remainder of this discussion, for simplicity, it is assumed that the front-end equalizer is placing the signal samples right on the desired target values and that there is no need for further mean corrections. The focus is shifted to tracking the noise covariance matrices needed in the computation of the branch metrics (13).

Assume that the sequence of samples $r_i, r_{i+1}, \ldots, r_{i+L}$ is observed. Based on these and all other neighboring samples, after an appropriate delay of the Viterbi trellis, a decision is made that the most likely estimate for the sequence of symbols $a_{i-K_l}, \ldots, a_{i+L+K_t}$ is $\hat{a}_{i-K_l}, \ldots, \hat{a}_{i+L+K_t}$. Here L is the noise correlation length and $K = K_l + K_t + 1$ is the ISI length. Let the current estimate for the $(L+1) \times (L+1)$ covariance matrix corresponding to the sequence of symbols $\hat{a}_{i-K_l}, \ldots, \hat{a}_{i+L+K_t}$ be $\hat{C}(\hat{a}_{i-K_l}, \ldots, \hat{a}_{i+L+K_t})$.

This symbol is abbreviated with the shorter notation, $\hat{C}(\hat{a})$. If the estimate is unbiased, the expected value of the estimate is:

$$E\hat{C}(\hat{a}) = E[\underline{N}_i \underline{N}_i^T] \tag{21}$$

where $\underline{N}_i$ is the vector of differences between the observed samples and their expected values, as defined in (12).

Note that once the samples $r_i, r_{i+1}, \ldots, r_{i+L}$ are observed, and once it is decided that most likely they resulted from a series of written symbols $\hat{a}_{i-K_l}, \ldots, \hat{a}_{i+L+K_t}$, the sequence of target (mean) values $m_i, m_{i+1}, \ldots, m_{i+L}$ is known that correspond to these samples. They are used to compute the vector $\underline{N}_i$, with which the empirical rank-one covariance matrix $\underline{N}_i \underline{N}_i^T$ is formed. In the absence of prior information, this rank-one matrix is an estimate for the covariance matrix for the detected symbols. In a recursive adaptive scheme, this rank-one data covariance estimate is used to update the current estimate of the covariance matrix $\hat{C}(\hat{a})$. A simple way to achieve this is provided by the recursive least-squares (RLS) algorithm. The RLS computes the next covariance matrix estimate $\hat{C}'(\hat{a})$ as:

$$\hat{C}'(\hat{a}) = \beta(t)\hat{C}(\hat{a}) + [1-\beta(t)]\underline{N}_i \underline{N}_i^T \tag{22}$$

Here, $\beta(t)$, $0 < \beta(t) < 1$, is a forgetting factor. The dependence on t signifies that $\beta$ is a function of time. Equation (22) can be viewed as a weighted averaging algorithm, where the data sample covariance $\underline{N}_i \underline{N}_i^T$ is weighted by the factor $[1-\beta(t)]$, while the previous estimate is weighted by $\beta(t)$. The choice of $\beta(t)$ should reflect the nonstationarity degree of the noise. For example, if the nonstationarity is small, $\beta(t)$ should be close to 1, while it should drop as the nonstationarity level increases. The forgetting factor is typically taken time-dependent to account for the start-up conditions of the RLS algorithm in (22). As more data is processed, a steady-state is expected to be achieved and $\beta(t)$ is made to approach a constant value. Initially, $\beta(t)$ is close to zero, to reflect the lack of a good prior estimate $\hat{C}(\hat{a})$, and to rely more on the data estimate. With time, $\beta(t)$ is increased and settles around a value close to 1.

The impact of the initial conditions in (22) decays exponentially fast. Hence, the algorithm (22) can be started with an arbitrary initial guess for the covariance matrix $\hat{C}(\hat{a})$, with the only constraint being that the matrix be positive semidefinite, e.g., a zero matrix or an identity matrix.

The one-dimensional equivalent of equation (22) is $$\hat{\sigma}_{new}^2 = \beta \hat{\sigma}_{old}^2 + [1-\beta]N_i^2. \tag{23}$$

This equation can be used in conjunction with the metric in (10).

It is important to point out that, due to the signal-dependent character of the media noise, there will be a different covariance matrix to track for each branch in the tree-trellis of the Viterebi-like detector. Practical considerations of memory requirements, however, limit the dimensions of the matrices to be tracked. Fortunately, simple 2×2 matrices are enough to show substantial improvement in error rate performance.

Figure 4:
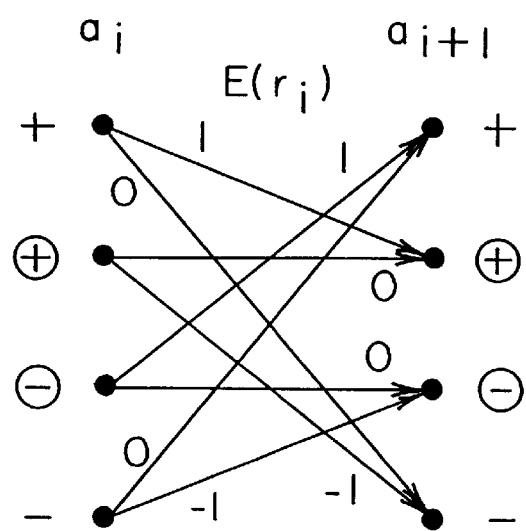
FIG. 4 is an illustration of one cell of a PR4 trellis.

The following example illustrates how the algorithm in (22) works. Assume a PR4 target response with a simple trellis structure as shown in FIG. 4 Notice that for PR4, the symbols can be equated to the trellis states, as is illustrated in FIG. 4 The number next to each branch in FIG. 4 represents the target value (mean sample value) for the corresponding path between states. The target values in PR4 can be one of three values −1, 0, or 1.

In this example a noise correlation length of L=1 is assumed. It is also assumed that the leading and trailing ISI lengths are $K_l = 0$ and $K_t = 1$, respectively, to give the total ISI length $K = K_l + K_t + 1 = 2$ for the PR4 response. Because L=1, signal covariance matrices of size $(L+1) \times (L+1) = 2 \times 2$ need to be tracked. The number of these matrices equals the number of different combinations of two consecutive branches in the trellis. A simple count in FIG. 4 reveals that this number is 16, because there are 4 nodes in the trellis and 2 branches entering and leaving each node.

Figure 5:
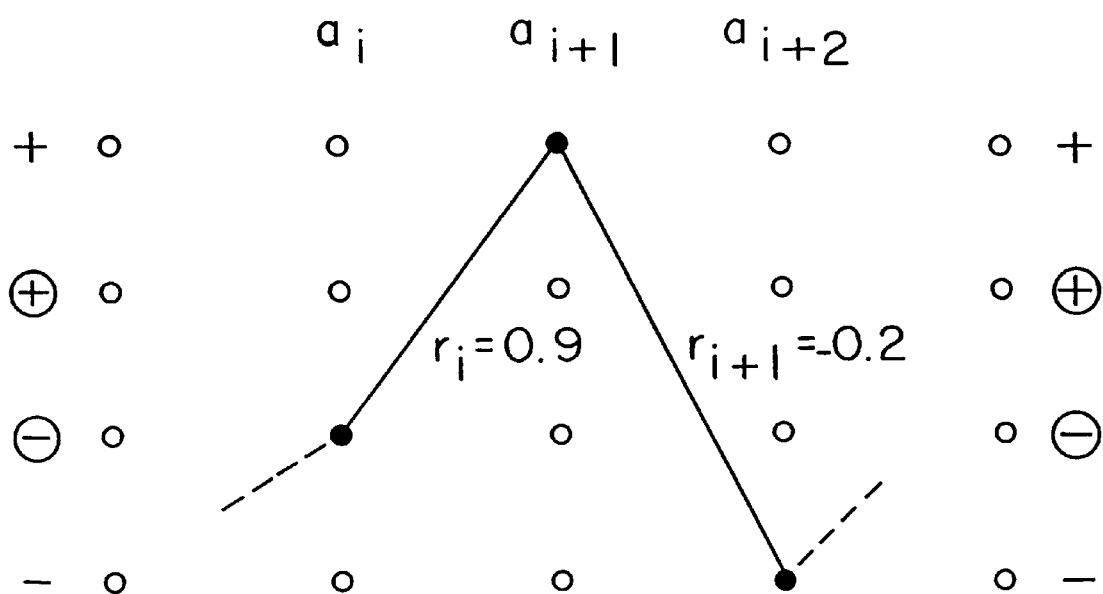
FIG. 5 is an illustration of a detected path in a PR4 trellis.

Assume that, using the branch metric in (13), the Viterbi-like detector decides that the most likely written symbols $a_i$, $a_{i+1}$, $a_{i+2}$, equal $\{\hat{a}_i, \hat{a}_{i+1}, \hat{a}_{i+2}\} = \{\ominus, +, -\}$. This is illustrated in FIG. 5, where the corresponding path through the trellis is highlighted. The noisy signal samples corresponding to the trellis branches are $r_i = 0.9$ and $r_{i+1} = -0.2$, which deviate slightly from their ideal partial response target values of 1 and 0, respectively.

Suppose that, prior to making the decision $\{\hat{a}_i, \hat{a}_{i+1}, \hat{a}_{i+2}\} = \{\ominus, +, -\}$, the estimate for the covariance matrix associated with this sequence of three symbols is $$\hat{C}(\ominus, +, -) = \begin{bmatrix} 0.5 & -0.2 \\ -0.2 & 0.8 \end{bmatrix} \tag{24}$$

Let the forgetting factor be B=0.95. To update the covariance matrix the vector is first formed:

$$\underline{N} = [(r_i - 1)(r_{i+1} - 0)]^T = [-0.1 \ -0.2]^T \tag{25}$$

The rank-one sample covariance matrix $\underline{N}\,\underline{N}^T$ is used to find the covariance matrix update:

$$\hat{C}'(\ominus, +, -) = \beta \hat{C}(\ominus, +, -) + (1-\beta)\underline{N}\,\underline{N}^T \quad (26)$$

$$= \begin{bmatrix} 0.4755 & -0.189 \\ -0.189 & 0.7620 \end{bmatrix}$$

The matrix $\hat{C}'(\ominus, +, -)$ becomes our estimate for the covariance matrix corresponding to this particular symbol sequence (trellis path) and is used to compute the metrics (13) in the subsequent steps of the Viterbi-like algorithm.

Figure 6:
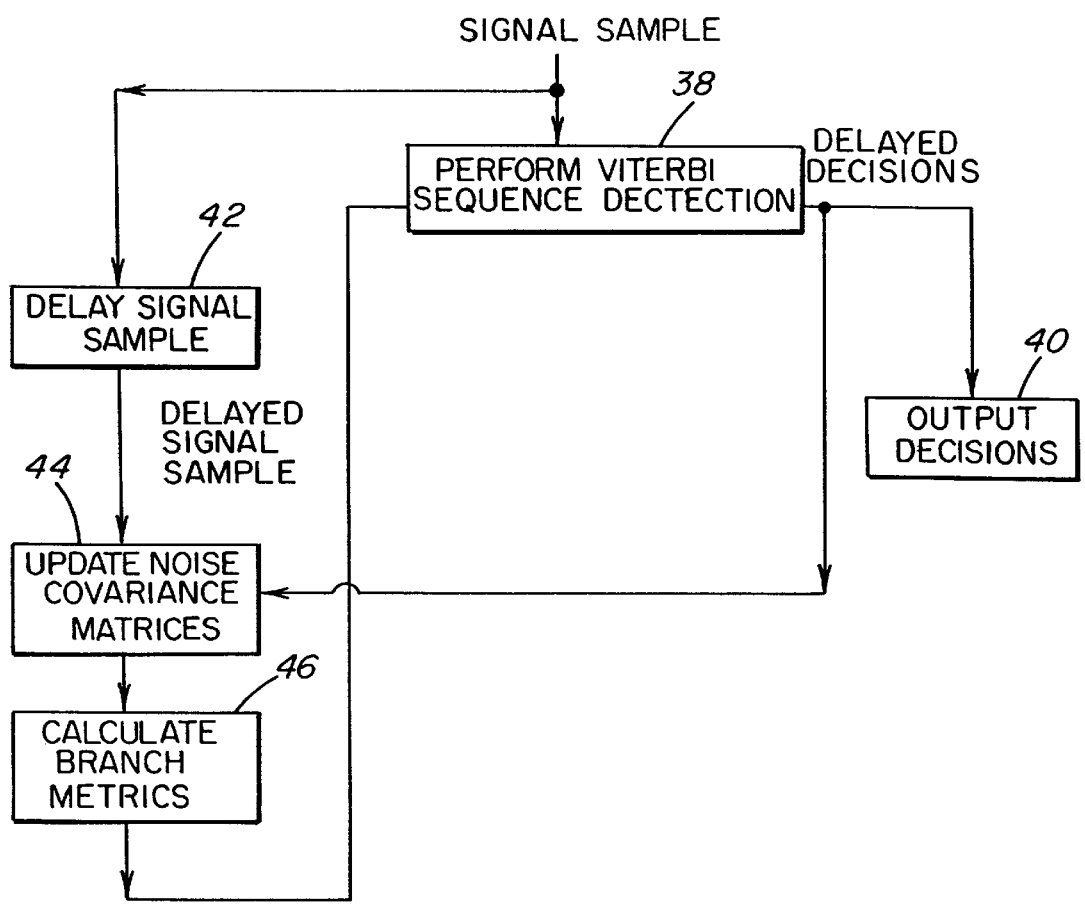
FIG. 6 is a block diagram of a preferred embodiment of a method for signal detection.

FIG. 6 illustrates a flowchart of a method of detecting a sequence of adjacent signal samples stored on a high density magnetic recording device. Viterbi sequence detection is performed using a signal sample at step 38. The sequence detection produces decisions which are output at step 40. The signal sample is delayed at step 42. The past samples and detector decisions are used to update the noise statistics at step 44. Branch metrics, which are used in the sequence detection step 38, are calculated at step 46.

It can be understood by those skilled in the art that the method of FIG. 6 can be performed on a computer. The steps may be coded on the computer as a series of instructions, which, when executed, cause the computer to detect a sequence of adjacent signal samples stored on a high density magnetic recording device. The computer may be, for example, a personal computer, a workstation, or a mainframe computer. The computer may also have a storage device, such as a disk array, for storage of the series of instructions.

Simulation results using two partial response detection algorithms, namely PR4 and EPR4 are now presented. To create realistic waveforms, corrupted by media noise, an efficient stochastic zig-zag model, the TZ-ZT model was used. These waveforms are then passed through the detectors. A Lindholm inductive head is used for both writing and reading. Table 1 presents the recording parameters of the model. These recording parameters are chosen so that with a moderately low symbol density per PW50, a low number of transition widths a per symbol transition separation results. Namely, at 3 symbols/PW50 a transition separation of only 2.9a is present. The transition profile was modeled by an error function, where the transition width a denotes the distance from the transition center to the point where the magnetization equals $M_r/2$.

TABLE 1

Recording parameters used in simulations.

| Parameter | Symbol | Value |
| --- | --- | --- |
| media remanence | $M_r$ | 450kA/m |
| media coercivity | $H_c$ | 160kA/m |
| media thickness | $\delta$ | 0.02 μm |
| media cross-track correlation width | s | 200Å |
| head-media separation | d | 15 nm |
| head field gradient factor | Q | 0.8 |
| had gap length | g | 0.135 μm |
| track width | TW | 2 μm |
| transition width parameter | α | 0.019 μm |
| percolation length | L = 1.4α | 0.0266 μm |
| 50% pulse width | PW50 | 0.167 μm |

Table 1: Recording Parameters Used in Simulations

The symbols utilizing the (0,4) run length limited code are written. No error correction is applied, so the obtained error rates are not bit error rates, but (raw) symbol error rates.

Both the PR4 and EPR4 detectors were tested using the following three different metric computation methods: the Euclidian metric (8), the variance dependent metric (10), also referred to as the C1 metric, and the 2×2 correlation sensitive metric (13), named the C2 metric for short. For a PR4 target response, the total ISI length is $K=K_l+K_r+1=2$, where the leading and trailing ISI lengths are $K_l=0$ and $K_r=1$, respectively. The noise correlation length for the Euclidian and the C1 metrics is L=0, and for the C2 metric the noise correlation length is L=1. These three PR4 detectors are referred to as PR4(Euc), PR4(C1), and PR4(C2).

Similarly to the PR4 detectors, three EPR4 detectors were tested, EPR4(Euc), EPR4(C1) and EPR4(C2). The only difference between the PR4 detectors and the EPR4 detectors are the target response and the ISI length, which for the EPR4 target response equals $K=K_l+K_r+1=3$, with $K_l=1$ and $K_r=1$.

The signal obtained by the TZ-ZT model is already corrupted with media noise. To this signal white Gaussian noise was added to simulate the head and electronics noise in a real system. The power of the additive white Gaussian noise is quoted as the signal to additive white Gaussian noise ratio, S(AWG)NR, which is obtained as:

$$S(AWG)NR = 10\log\frac{A_{iso}^2}{\sigma_n^2} \quad (27)$$

where $A_{iso}$ is the mean (media noise free) amplitude of an isolated pulse and $\sigma_n^2$ is the variance of the additive white Gaussian noise. The noise distorted signal is first passed through a low-pass filter to clean out the noise outside the Nyquist band- The signal is then sampled at a rate of one sample per symbol and subsequently passed through a partial response shaping filter, either PR4 or EPR4. The partial response shaping filter is implemented as an adaptive FIR filter whose tap weights are adjusted using the LMS algorithm. Note that both filters add correlation to the noise. For the C1 and C2 metrics in (10) and (13), the RLS algorithms (22) and (23) are used to estimate the noise variances and covariance matrices for the branch metric computations. In both cases, the forgetting factor is set to β=0.95.

All six detection algorithms were tested at three different recording densities.

Figure 7:
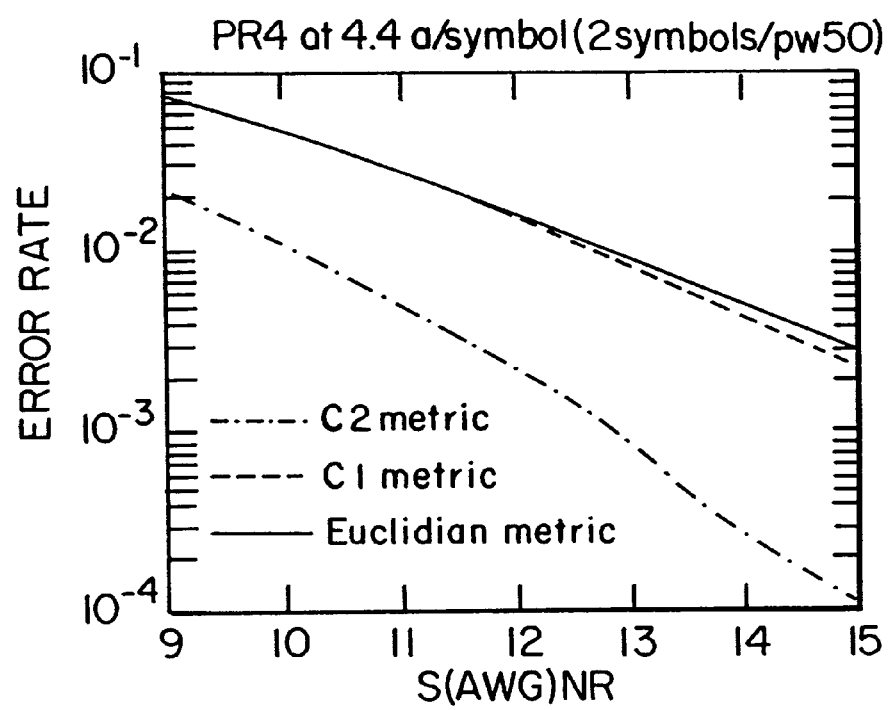
FIG. 7 is an illustration of PR4 detection results at a 4.4 a/symbol.
Figure 8:
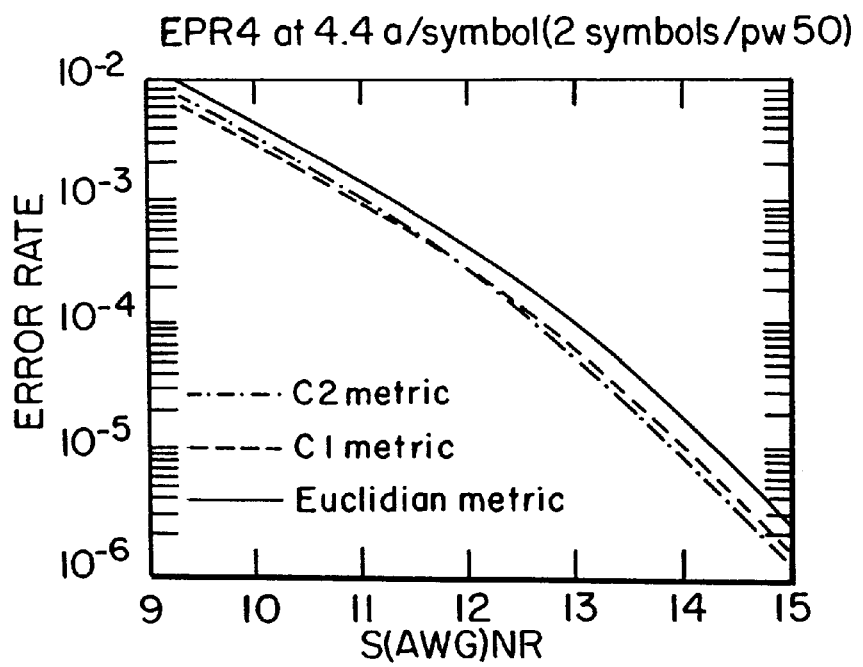
FIG. 8 is an illustration of EPR4 detection results at a 4.4 a/symbol.

Symbol separation of 4.4a. This recording density corresponds to a symbol density of 2 symbols/PW50, see Table 1. FIG. 7 shows the symbol error rate performance of the PR4 detectors for different additive noise SNRs. The media noise is embedded in the system, which is why the x-axis on the graph is labeled as S(AWG)NR instead of simply SNR. At this density, the PR4(Euc) and PR4(C1) detectors perform just about the same and the PR4(C2) detector outperforms them both by about 3 dB. The reason for this is that the PR4 shaping filter averages noise samples from different symbols, which masks the signal dependent nature of the media noise. This is why there is not much to gain by using PR4(C1) instead of PR4(Euc). The PR4(C2) detector performs better because it partially removes the effects of noise correlation introduced by the PR4 shaping filter. FIG. 8 shows how the EPR4 detectors perform at this same density (symbol separation 4.4a). The PR4(C2) has the best performance and PR4(Euc) has the worst. The difference in performance at the error rate of $10^{-5}$ is only about 0.5 dB between PR4(Euc) and PR4(C2). This is because the media noise power at this density is low and the signal is well matched to the target so the EPR4 shaping filter does not introduce unnecessary noise correlation.

Figure 9:
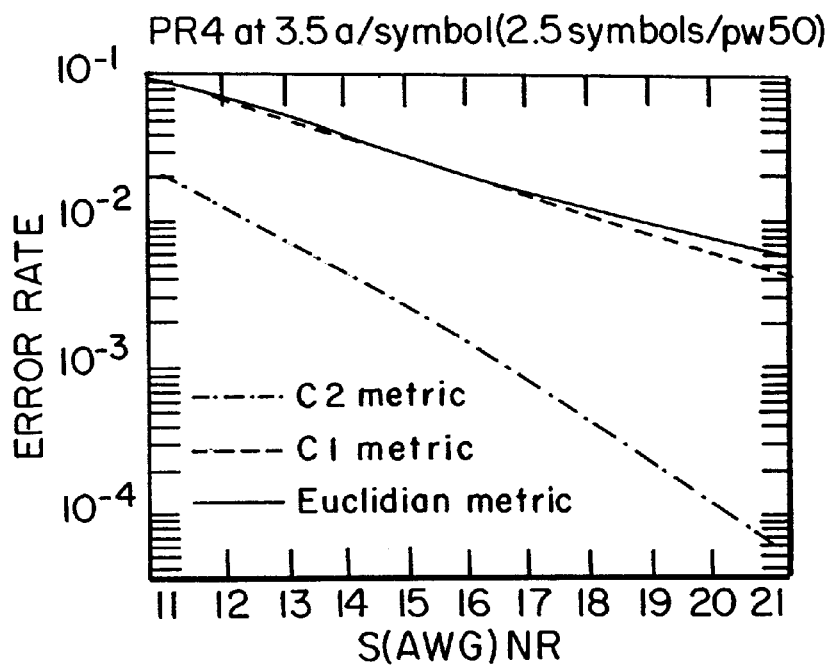
FIG. 9 is an illustration of PR4 detection results at a 3.5 a/symbol.

Symbol separation of 3.5a. This recording density corresponds to a symbol density of 2.5 symbols/PW50. FIG. 9 shows the performance of the PR4 detectors at this density. FIG. 9 is similar to FIG. 7, except that the error rates have increased. This is again due to a mismatch between the original signal and the PR4 target response, which is why the PR4 shaping filter introduces correlation in the noise. PR4 (C2) still outperforms the two other algorithms, showing the value of exploiting the correlation across signal samples.

Figure 10:
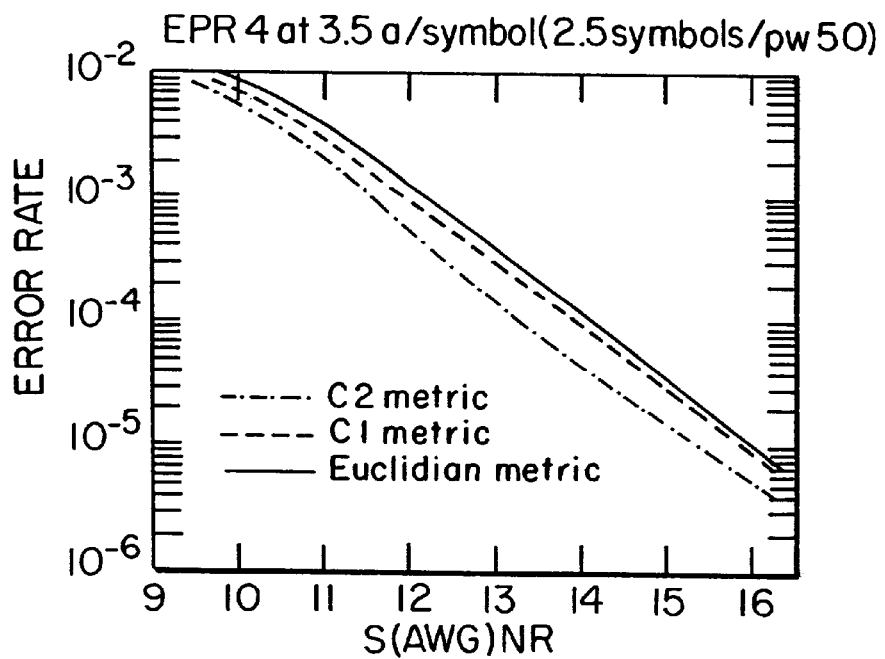
FIG. 10 is an illustration of EPR4 detection results at a 3.5 a/symbol.
Figure 11:
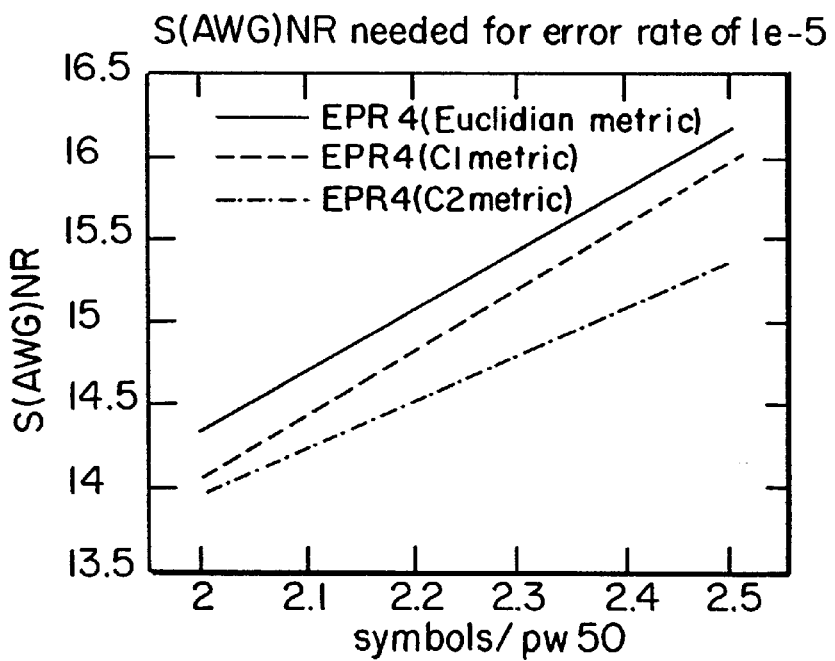
FIG. 11 is an illustration of S(AWG)NR margins needed for error rate of $10^{-5}$ with EPR4 detectors.

FIG. 10 shows the error rates obtained when using the EPR4 detectors. Due to a higher density, the media noise is higher than in the previous example with symbol separations of 4.4a. This is why the graph in FIG. 10 has moved to the right by 2 dB in comparison to the graph in FIG. 8. While the required S(AWG)NR increased, the margin between the EPR4(Euc) and EPR4(C2) also increased from about 0.5 dB to about 1 dB, suggesting that the correlation-sensitive metric is more resilient to density increase. This is illustrated in FIG. 11 where the S(AWG)NR required for an error rate of $10^{-5}$ is plotted versus the linear density for the three EPR4 detectors. From FIG. 11 it can be seen that, for example, with an S(AWG)NR of 15 dB, the EPR(Euc) detector operates at a linear density of about 2.2 symbols/PW50 and the EPR4(C2) detector operates at 2.4 symbols/PW50, thus achieving a gain of about 10% of linear density.

Figure 12:
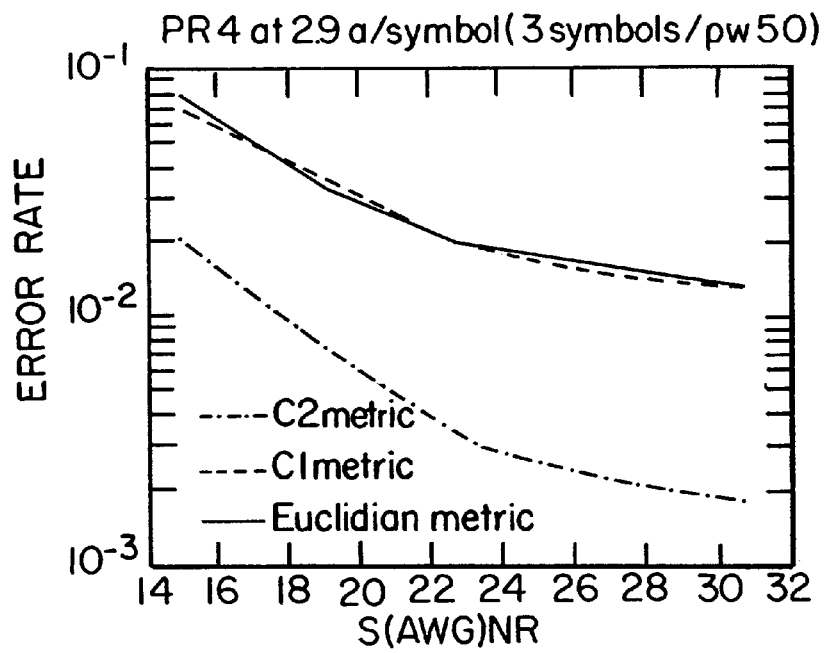
FIG. 12 is an illustration of PR4 detection results at a 2.9 a/symbol.
Figure 13:
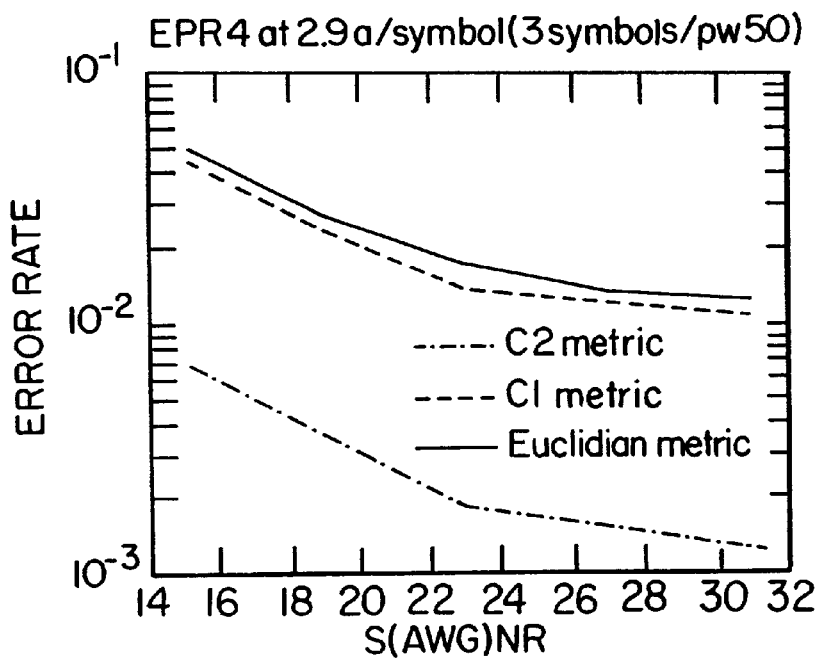
FIG. 13 is an illustration of EPR 4 detection results at a 2.9 a/symbol.

Symbol separation of 2.9a. This recording density corresponds to a symbol density of 3 symbols/PW50. Due to a very low number of symbols per a, this is the density where the detectors significantly lose performance due to the percolation of magnetic domains, also referred to as non-linear amplitude loss or partial signal erasure. FIGS. 12 and 13 show the performance of the PR4 and EPR4 families of detectors at this density. The detectors with the C2 metric outperform the other two metrics. The error rates are quite high in all cases. This is because at the symbol separations of 2.9a, nonlinear effects, such as partial erasure due to percolation of domains, start to dominate. These effects can only be undone with a nonlinear pulse shaping filter, which have not been employed here.

The experimental evidence shows that the correlation sensitive sequence detector outperforms the correlation insensitive detectors. It has also been demonstrated that the performance margin between the correlation sensitive and the correlation insensitive detectors grows with the recording density. In other words, the performance of the correlation insensitive detector deteriorates faster than the performance of the correlation sensitive detector. Quantitatively, this margin depends on the amount of correlation in the noise passed through the system. Qualitatively, the higher the correlation between the noise samples, the greater will be the margin between the CS-SD and its correlation insensitive counter part.

While the present invention has been described in conjunction with preferred embodiments thereof, many modifications and variations will be apparent to those of ordinary skill in the art. For example, the present invention may be used to detect a sequence that exploits the correlation between adjacent signal samples for adaptively detecting a sequence of symbols through a communications channel. The foregoing description and the following claims are intended to cover all such modifications and variations.

What is claimed is:

1. A method of determining branch metric values for branches of a trellis for a Virterbi-like detector, comprising:
    selecting a branch metric function for each of the branches at a certain time index; and
    applying each of said selected functions to a plurality of signal samples to determine the metric value corresponding to the branch for which the applied branch metric function was selected, wherein each sample corresponds to a different sampling time instant.

2. The method of claim 1 further comprising the step of receiving said signal samples, said signal samples having signal-dependent noise, correlated noise, or both signal-dependent and correlated noise associated therewith.

3. The method of claim 1 wherein said branch metric functions for each of the branches are selected from a set of signal-dependent branch metric functions.

4. A method of determining branch metric values for branches of a trellis for a Viterbi-like detector, comprising:
    selecting a branch metric function for each of the branches at a certain time index from a set of signal-dependent branch metric functions; and
    applying each of said selected functions to a plurality of signal samples to determine the metric value corresponding to the branch for which the applied branch metric function was selected, wherein each sample corresponds to a different sampling time instant.

5. The method of claim 4 further comprising the step of receiving said signal samples, said signal samples having signal-dependent noise, correlated noise, or both signal-dependent and correlated noise associated therewith.

6. A method of generating a signal-dependent branch weight for branches of a trellis for a Viterbi-like detector, comprising:
    selecting a plurality of signal samples, wherein each sample corresponds to a different sampling time instant;
    calculating a first value representing a branch-dependent joint probability density function of a subset of said signal samples;
    calculating a second value representing a branch dependent joint probability density function of said signal samples;
    calculating the branch weight from said first and second values; and
    outputting the branch weight.

7. The method of claim 6 further comprising the step of correcting the branch weight by an additive term.

8. The method of claim 6 further comprising the step of correcting the branch weight by a multiplicative term.

9. The method of claim 7 wherein said correcting step includes the step of selecting a third value representing a prior branch probability for use as said additive term.

10. A method of generating a branch weight for branches of a trellis for a Viterbi-like detector, wherein the detector is used in a system having Gaussian noise, comprising:
    selecting a plurality of signal samples, wherein each sample corresponds to a different sampling time instant;
    calculating a first value representing a logarithm of a quotient of a determinant of a trellis branch dependent covariance matrix of said signal samples and a determinant of a trellis branch dependent covariance matrix of a subset of said signal samples;
    calculating a second value representing a quadratic of said signal samples less a plurality of target values normalized by a trellis branch dependent covariance of said signal samples;
    calculating a third value representing a quadratic of a subset of said signal samples less a plurality of channel target values normalized by a trellis branch dependent covariance of said subset of signal samples;
    calculating the branch weight from said first, second, and third values; and outputting said branch weight.

11. A method for detecting a sequence that exploits the correlation between adjacent signal samples for adaptively detecting a sequence of symbols stored on a high density magnetic recording device, comprising the steps of:
(a) performing a Virterbi-like sequence detection on a plurality of signal samples using a plurality of correlation sensitive branch metrics;
(b) outputting a delayed decision on the recorded symbol;
(c) outputting a delayed signal sample;
(d) adaptively updating a plurality of noise covariance matrices in response to said delayed signal samples and said delayed decisions;
(e) recalculating said plurality of correlation-sensitive branch metrics from said noise covariance matrices using subsequent signal samples; and
(f) repeating steps (a)–(e) for every new signal sample.

12. The method of claim 11 wherein said Virterbi-like sequence detection is performed using a PRML algorithm.

13. The method of claim 11 wherein said Virterbi-like sequence detection is performed using an FDTS/DF algorithm.

14. The method of claim 11 wherein said Virterbi-like sequence detection is performed using an RAM-RSE algorithm.

15. The method of claim 11 wherein said Virterbi-like sequence detection is performed using an MDFE algorithm.

16. A method for detecting a sequence that exploits the correlation between adjacent signal samples for adaptively detecting a sequence of symbols through a communications channel having intersymbol interference, comprising the steps of:
(a) performing a Virterbi-like sequence detection on a plurality of signal samples using a plurality of correlation sensitive branch metrics;
(b) outputting a delayed decision on the transmitted symbol;
(c) outputting a delayed signal sample;
(d) adaptively updating a plurality of noise covariance matrices in response to said delayed signal samples and said delayed decisions;
(e) recalculating said plurality of correlation-sensitive branch metrics from said noise covariance matrices using subsequent signal samples; and
(f) repeating steps (a)–(e) for every new signal sample.

17. The method of claim 16 wherein said channel has nonstationary noise.

18. The method of claim 16 wherein said channel has nonstationary signal dependent noise.

19. A detector circuit for detecting a plurality of data from a plurality of signal samples read from a recording medium, comprising:
a Viterbi-like detector circuit, said Viterbi-like detector circuit for producing a plurality of delayed decisions and a plurality of delayed signal samples from a plurality of signal samples;
a noise statistics tracker circuit responsive to said Viterbi-like detector circuit for updating a plurality of noise covariance matrices in response to said delayed decisions and said delayed signal samples; and
a correlation-sensitive metric computation update circuit responsive to said noise statistics tracker circuit for recalculating a plurality of correlation-sensitive branch metrics from said noise covariance matrices, said branch metrics output to said Viterbi-like detector circuit.

20. A branch metric computation circuit for generating a branch weight for branches of a trellis for a Viterbi-like detector, wherein the detector is used in a system having Gaussian noise, comprising:
a logarithmic circuit having for each branch an input responsive to a branch address and an output;
a plurality of arithmetic circuits each having a first input responsive to a plurality of signal samples, a second input responsive to a plurality of target response values, and an output, wherein each of the arithmetic circuits corresponds to each of the branches;
a sum circuit having for each branch a first input responsive to said output of said logarithmic circuit, a second input responsive to said output of said arithmetic circuit, and an output.

21. The circuit of claim 20 wherein said branch metric computation circuit is a tapped-delay line circuit with adaptive weight.

22. The circuit of claim 20 wherein said branch metric computation circuit is an adaptive linear filter circuit.

23. A system for recording information on a magnetic medium, comprising:
a write signal processing circuit for processing a plurality of data from a data source;
a write control circuit;
a write head responsive to said write control circuit for receiving a plurality of signals from said write signal processing circuit, said write head for writing said signals to the recording medium;
a read control circuit;
a read head for reading said signals from the recording medium, said read head responsive to said read control circuit; and
a detector circuit for detecting a plurality of data from said read signals, said detector comprising:
a Viterbi-like detector circuit, said Viterbi-like detector circuit for producing a plurality of delayed decisions and a plurality of delayed signal samples from a plurality of signal samples;
a noise statistics tracker circuit responsive to said Viterbi-like detector circuit for updating a plurality of noise covariance matrices in response to said delayed decisions and said delayed signal samples; and
a correlation-sensitive metric computation update circuit responsive to said noise statistics tracker circuit for recalculating a plurality of correlation-sensitive branch metrics from said noise covariance matrices, said branch metrics output to said Viterbi-like detector circuit.

24. A system for recording information on a magnetic medium, comprising;
a write signal processing circuit for processing a plurality of data from a data source;
a write control circuit;
a write head responsive to said write control circuit for receiving a plurality of signals from said write signal processing circuit, said write head for writing said signals to the recording medium;
a read control circuit;
a read head for reading said signals from the recording medium, said read head responsive to said read control circuit; and
a detector circuit for detecting a plurality of data from said read signals, said detector circuit having a circuit for selecting a branch metric function for each branch of a trellis and for applying said metric function to a plurality of time variant signal samples to determine a plurality of branch metric values.

25. A system for recording information on a magnetic medium, comprising;

a write signal processing circuit for processing a plurality of data from a data source;

a write control circuit;

a write head responsive to said write control circuit for receiving a plurality of signals from said write signal processing circuit, said write head for writing said signals to the recording medium;

a read control circuit;

a read head for reading said signals from the recording medium, said read head responsive to said read control circuit; and a detector circuit for detecting a plurality of data from said read signals, said detector circuit having a circuit for selecting a branch metric function for each branch of a trellis at a certain time index from a set of signal-dependent branch metric functions and for applying said selected function to a plurality of time variant signal samples to determine a plurality of branch metric values.

26. A system for recording information on a magnetic medium, comprising;

a write signal processing circuit for processing a plurality of data from a data source;

a write control circuit;

a write head responsive to said write control circuit for receiving a plurality of signals from said write signal processing circuit, said write head for writing said signals to the recording medium;

a read control circuit;

a read head for reading said signals from the recording medium, said read head responsive to said read control circuit; and a detector circuit for detecting a plurality of data from said read signals, said detector circuit having a tapped-delay line branch metric computation circuit, the computation circuit including:

a logarithmic circuit having for each branch an input responsive to a branch address and an output;

a plurality of arithmetic circuits each having a first input responsive to a plurality of signal samples, a second input responsive to a plurality of target response values, and an output, wherein each of the arithmetic circuits corresponds to each of the branches;

a sum circuit having for each branch a first input responsive to said output of said logarithmic circuit, a second input responsive to said output of said arithmetic circuit, and an output.

27. A computer-readable medium having stored thereon instructions which, when executed by a processor, cause said processor to perform the steps of:

selecting a branch metric function for each branch of a trellis for a Viterbi-like detector at a certain time index; and applying each of said selected functions to a plurality of time variant signal samples to determine a branch metric value corresponding to the branch for which the applied branch metric function was selected.

28. A computer-readable medium having stored thereon instructions which, when executed by a processor, cause said processor to perform the steps of:

selecting a branch metric function for each branch of a trellis for a Viterbi-like detector at a certain time index from a set of signal-dependent branch metric functions; and applying each of said selected functions to a plurality of time variant signal samples to determine a branch metric value corresponding to the branch for which the applied branch metric function was selected.

* * * * *

UNITED STATES PATENT AND TRADEMARK OFFICE
CERTIFICATE OF CORRECTION

PATENT NO. : 6,201,839 B1
DATED : March 13, 2001
INVENTOR(S) : Kavcic et al.

Page 1 of 1

It is certified that error appears in the above-identified patent and that said Letters Patent is hereby corrected as shown below:

Column 5,
Line 64, should read "pdf's", missing a apostrophe.

Column 6,
Line 56, delete "submatrix of $C_i = [c_i]$ and replace with -- submatrix of $C_i = [\bar{c_i}]$ --.

Column 12,
Line 30, delete "band-" and replace therewith -- band. --.

Signed and Sealed this

Fifth Day of March, 2002

Attest:

*Attesting Officer*

JAMES E. ROGAN
*Director of the United States Patent and Trademark Office*

(12) EX PARTE REEXAMINATION CERTIFICATE (10368th)
United States Patent
Kavcic et al.

(10) Number: US 6,201,839 C1
(45) Certificate Issued: Oct. 29, 2014

(54) METHOD AND APPARATUS FOR CORRELATION-SENSITIVE ADAPTIVE SEQUENCE DETECTION

(75) Inventors: Aleksandar Kavcic, Pittsburgh, PA (US); Jose M. F. Moura, Pittsburgh, PA (US)

(73) Assignee: Carnegie Mellon University, Pittsburgh, PA (US)

Reexamination Request:
No. 90/013,125, Jan. 21, 2014

Reexamination Certificate for:
Patent No.: 6,201,839
Issued: Mar. 13, 2001
Appl. No.: 09/055,003
Filed: Apr. 3, 1998

Certificate of Correction issued Mar. 5, 2002

Related U.S. Application Data

(60) Provisional application No. 60/046,006, filed on May 9, 1997.

(51) Int. Cl.
*H03M 13/41* (2006.01)
*H03M 13/00* (2006.01)
*H04L 25/03* (2006.01)

(52) U.S. Cl.
USPC .......................................... 375/341; 714/796

(58) Field of Classification Search
None
See application file for complete search history.

(56) References Cited

To view the complete listing of prior art documents cited during the proceeding for Reexamination Control Number 90/013,125, please refer to the USPTO's public Patent Application Information Retrieval (PAIR) system under the Display References tab.

*Primary Examiner* — Linh M Nguyen

(57) ABSTRACT

The present invention is directed to a method of determining branch metric values for branches of a trellis for a Viterbi-like detector. The method includes the step of selecting a branch metric function for each of the branches at a certain time index. The method also includes the step of applying the selected function to a plurality of time variant signal samples to determine the metric values.

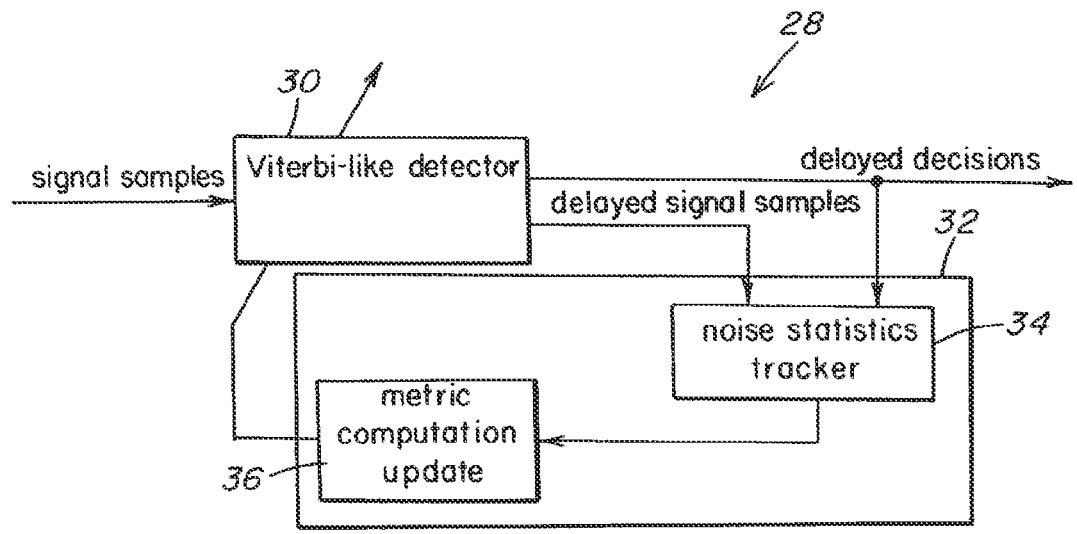

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claim 4 is confirmed.

Claims 1-3 and 5-28 were not reexamined.

* * * * *